(12) United States Patent
Shabbir et al.

(10) Patent No.: US 10,739,831 B2
(45) Date of Patent: Aug. 11, 2020

(54) CARD-BASED EXTENSION COOLING

(71) Applicant: Dell Products L.P., Round Rock, TX (US)

(72) Inventors: Hasnain Shabbir, Round Rock, TX (US); Dominick A. Lovicott, Jarrell, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/961,287

(22) Filed: Apr. 24, 2018

(65) Prior Publication Data
US 2019/0324506 A1 Oct. 24, 2019

(51) Int. Cl.
| | |
|---|---|
| *H05K 5/00* | (2006.01) |
| *G06F 1/20* | (2006.01) |
| *G06F 1/18* | (2006.01) |
| *H05K 7/20* | (2006.01) |
| *F04D 19/00* | (2006.01) |

(52) U.S. Cl.
CPC .............. *G06F 1/20* (2013.01); *F04D 19/002* (2013.01); *G06F 1/186* (2013.01); *H05K 7/20145* (2013.01); *H05K 7/20154* (2013.01); *H05K 7/20172* (2013.01); *G06F 2200/201* (2013.01)

(58) Field of Classification Search
CPC ........................................................ H05K 5/00
See application file for complete search history.

(56) References Cited

U.S. PATENT DOCUMENTS

| | | |
|---|---|---|
| 4,967,832 A | 11/1990 | Porter |
| 7,011,143 B2 | 3/2006 | Corrado et al. |
| 9,215,832 B2 | 12/2015 | Chang et al. |
| 9,414,525 B2 | 8/2016 | Campbell et al. |
| 9,516,791 B2 | 12/2016 | Chester et al. |
| 2003/0016498 A1 | 1/2003 | Kurokawa et al. |
| 2004/0008483 A1 | 1/2004 | Cheon |
| 2005/0065584 A1 | 3/2005 | Schiff et al. |
| 2006/0187638 A1* | 8/2006 | Vinson ............... G06F 1/20 361/698 |
| 2007/0010962 A1* | 1/2007 | Shih ............... G06F 11/2733 702/122 |
| 2007/0064394 A1 | 3/2007 | Chen et al. |
| 2007/0133171 A1 | 6/2007 | Cheon |
| 2007/0209782 A1 | 9/2007 | Wyatt et al. |
| 2011/0226446 A1 | 9/2011 | Davis |

(Continued)

OTHER PUBLICATIONS

Thermaltake, Tide Water All in one VGA Liquid Cooling Module, https://web.archive.org/web/20051018223829/http://www.thermaltake.com:80/watercooling/cl-w0052TideWater/cl-w0052.htm, obtained from Internet Mar. 15, 2018.

*Primary Examiner* — Jerry Wu
(74) *Attorney, Agent, or Firm* — Jackson Walker L.L.P.

(57) ABSTRACT

An information handling system may include a circuit board that includes a plurality of expansion slots. The information handling system may further include a cooling card coupled to at least one of the plurality of expansion slots, and a processor coupled to the circuit board (but where the cooling card does not contain the processor). Further, the processor may include a heat exchanger coupled thereto. The cooling card may include a heatsink, and a fluid channel thermally coupled to the heatsink, the fluid channel being fluidically coupled to the heat exchanger.

12 Claims, 2 Drawing Sheets

(56) References Cited

U.S. PATENT DOCUMENTS

| | | | |
|---|---|---|---|
| 2011/0279969 A1* | 11/2011 | Memon | G06F 1/20 |
| | | | 361/679.47 |
| 2012/0123595 A1 | 5/2012 | Bower, III et al. | |
| 2014/0153607 A1 | 6/2014 | Chainer et al. | |
| 2016/0124893 A1* | 5/2016 | Miyata | G06F 13/4282 |
| | | | 710/313 |
| 2016/0381838 A1 | 12/2016 | Nakanishi et al. | |
| 2017/0127575 A1 | 5/2017 | Lunsman et al. | |
| 2018/0279510 A1 | 9/2018 | Johnson et al. | |

* cited by examiner

CARD-BASED EXTENSION COOLING

TECHNICAL FIELD

The present disclosure relates in general to information handling systems, and more particularly to methods and systems for cooling of information handling systems and resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, heatsinks and/or air movers (e.g., cooling fans and blowers) have often been used in information handling systems to cool information handling systems and their components.

Oftentimes, it may be desirable to add additional cooling (e.g., liquid cooling) to an information handling resource, but physical and other constraints may make it difficult to do so. For example, adding additional cooling to a processor such as a central processing unit (CPU) or graphics processing unit (GPU), or to some other high-power chip or component on a motherboard or circuit board might require a substantial redesign of a chassis or of other elements of an information handling system. This may be particularly problematic in custom-designed hardware.

Thus it may be advantageous to be able to add cooling components in a modular fashion. This disclosure provides techniques that may be employed to assist cooling of information handling systems and information handling resources various situations. In some embodiments, cooling components may be located on expansion cards that may be coupled to expansion slots of an information handling system.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with cooling information handling systems and resources may be reduced or eliminated.

In accordance with embodiments of the present disclosure, an information handling system may include a circuit board that includes a plurality of expansion slots. The information handling system may further include a cooling card coupled to at least one of the plurality of expansion slots, and a processor coupled to the circuit board (but where the cooling card does not contain the processor). Further, the processor may include a heat exchanger coupled thereto. The cooling card may include a heatsink, and a fluid channel thermally coupled to the heatsink, the fluid channel being fluidically coupled to the heat exchanger.

In these and other embodiments, a method may include coupling a cooling card that includes a heatsink to an expansion slot of a circuit board of an information handling system, wherein the circuit board includes a processor, and wherein the processor includes a heat exchanger. The method may further include fluidically coupling a fluid channel of the heatsink to the heat exchanger.

In these and other embodiments, an apparatus may include a cooling card configured to be accepted by an expansion slot of an information handling system, wherein the information handling system includes a motherboard having a processor thereon. The cooling card may include a heatsink, and a fluid channel thermally coupled to the heatsink, the fluid channel being fluidically coupled to a heat exchanger that is configured to couple to the processor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
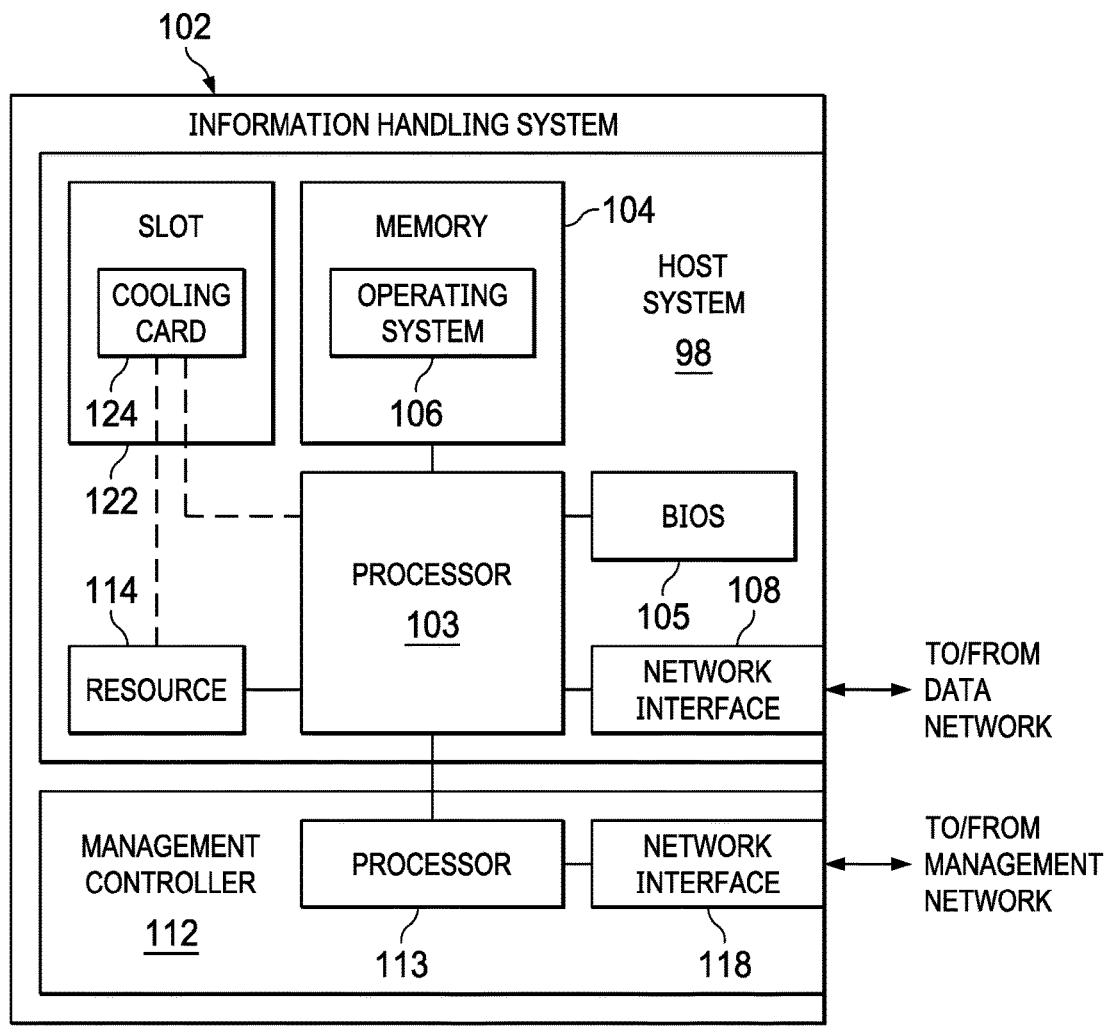
FIG. 1 illustrates a block diagram of an example information handling system, in accordance with some embodiments of the present disclosure.
Figure 3:
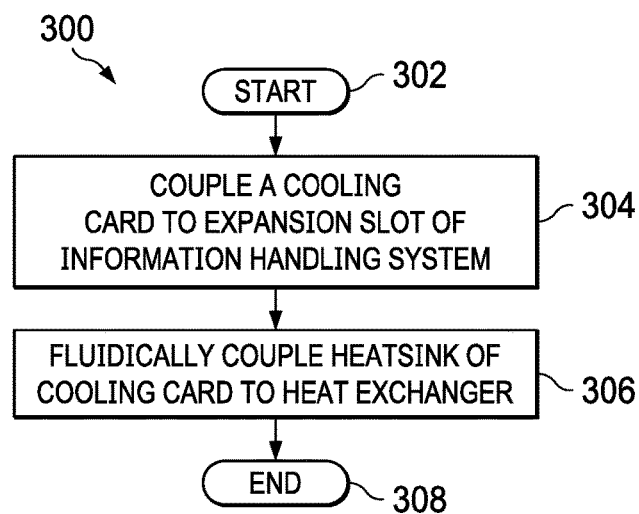
FIG. 3 illustrates a flow chart of an example method, in accordance with some embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected indirectly or directly, with or without intervening elements.

When two or more elements are referred to as "fluidically coupled" to one another, such term indicates that such two or more elements are coupled such that a fluid is able to flow between them.

When two or more elements are referred to as "thermally coupled" to one another, such term indicates that such two or more elements are coupled such that heat is able to flow between them with a relatively low thermal resistance. For example, a heatsink would be considered thermally coupled to a processor when attached thereto. However, that heatsink would not be considered thermally coupled to some other component with which it is not in physical contact (even though some amount of heat might be transferred via the ambient air, other indirect thermal pathways, etc.).

When two or more elements are referred to as "coupleable" to one another, such term indicates that they are capable of being coupled together.

For the purposes of this disclosure, computer-readable media (e.g., transitory or non-transitory computer-readable media) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, the term "expansion slot" may include any connector on a motherboard or other circuit board that is configured to receive an expansion card. Examples of expansion slots may include Peripheral Component Interconnect (PCI) slots, Peripheral Component Interconnect Express (PCIe) slots, Industry Standard Architecture (ISA), as well as other types of slots that may use other bus architectures.

For purposes of this disclosure, the term "heatsink" may include any solid apparatus (e.g., a heat pipe, heat spreader, finstack, etc.) that is configured to be thermally coupled to an information handling resource to transfer heat away from the information handling resource. In some embodiments, a heatsink may be coupled to a fluid channel, such that a fluid (e.g., water, mineral oil, or some other heat transfer fluid) may be thermally coupled to the heatsink. For example, such a heatsink may include such a cooling channel as an integral portion thereof, or it may be coupled to a separate cooling channel.

FIG. 1 illustrates a block diagram of an example information handling system 102. In some embodiments, information handling system 102 may comprise a personal computer. In some embodiments, information handling system 102 may comprise or be an integral part of a server. In other embodiments, information handling system 102 may comprise a portable information handling system (e.g., a laptop, notebook, tablet, handheld, smart phone, personal digital assistant, etc.). As depicted in FIG. 1, information handling system 102 may include a processor 103, a memory 104 communicatively coupled to processor 103, a BIOS 105 communicatively coupled to processor 103, a network interface 108 communicatively coupled to processor 103, and a management controller 112 communicatively coupled to processor 103.

Information handling system 102 may also include one or more information handling resources 114 communicatively coupled to processor 103. For example, information handling resource 114 may include a GPU or any other type of resource (typically a high-power, high-heat resource), which may be mounted on a motherboard of information handling system 102 or elsewhere within information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions, or aggregation of programs of executable instructions, configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102. In some embodiments, BIOS 105 may be used for network booting of a client information handling system from a server information handling system (e.g., via network interface 108).

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

In operation, processor 103, memory 104, BIOS 105, and network interface 108 may comprise at least a portion of a host system 98 of information handling system 102.

Management controller 112 may be configured to provide management facilities for management of information handling system 102. Such management may be made by management controller 112 even if information handling system 102 and/or host system 98 are powered off or powered to a standby state. Management controller 112 may include a processor 113, memory, and a management network interface 118 separate from and physically isolated from data network interface 108. In certain embodiments, management controller 112 may include or may be an integral part of a baseboard management controller (BMC), a chassis management controller (CMC), or a remote access controller (e.g., a Dell Remote Access Controller or Integrated Dell Remote Access Controller). In some embodiments, a plurality of host systems 98 may be present in information handling system 102, and management controller 112 may provide management of any or all of such host systems 98.

As shown in FIG. 1, processor 113 of management controller 112 may be communicatively coupled to processor 103. Such coupling may be via a Universal Serial Bus (USB), System Management Bus (SMBus), and/or one or more other communications channels.

Network interface 118 of management controller 112 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC." Network interface 118 may be the same type of device as network 108, or in other embodiments it may be a device of a different type.

As shown in FIG. 1, host system 98 may include one or more expansion slots 122. In accordance with embodiments of the present disclosure, cooling card 124 may be coupled to host system 98 via expansion slot 122. As discussed in more detail below, cooling card 124 may be used to provide additional cooling to one or more information handling resources of host system 98 or of information handling system 102.

In FIG. 1, cooling card 124 is shown as coupled to both processor 103 and information handling resource 114 in this example. In some embodiments, such coupling may be implemented such that cooling card 124 is thermally and/or fluidically coupled to a heat exchanger, which may be used to cool processor 103, information handling resource 114, or some other information handling resource (not shown). In these and other embodiments, cooling card 124 may be used to cool one such information handling resource, or more than one such information handling resource.

Figure 2A:
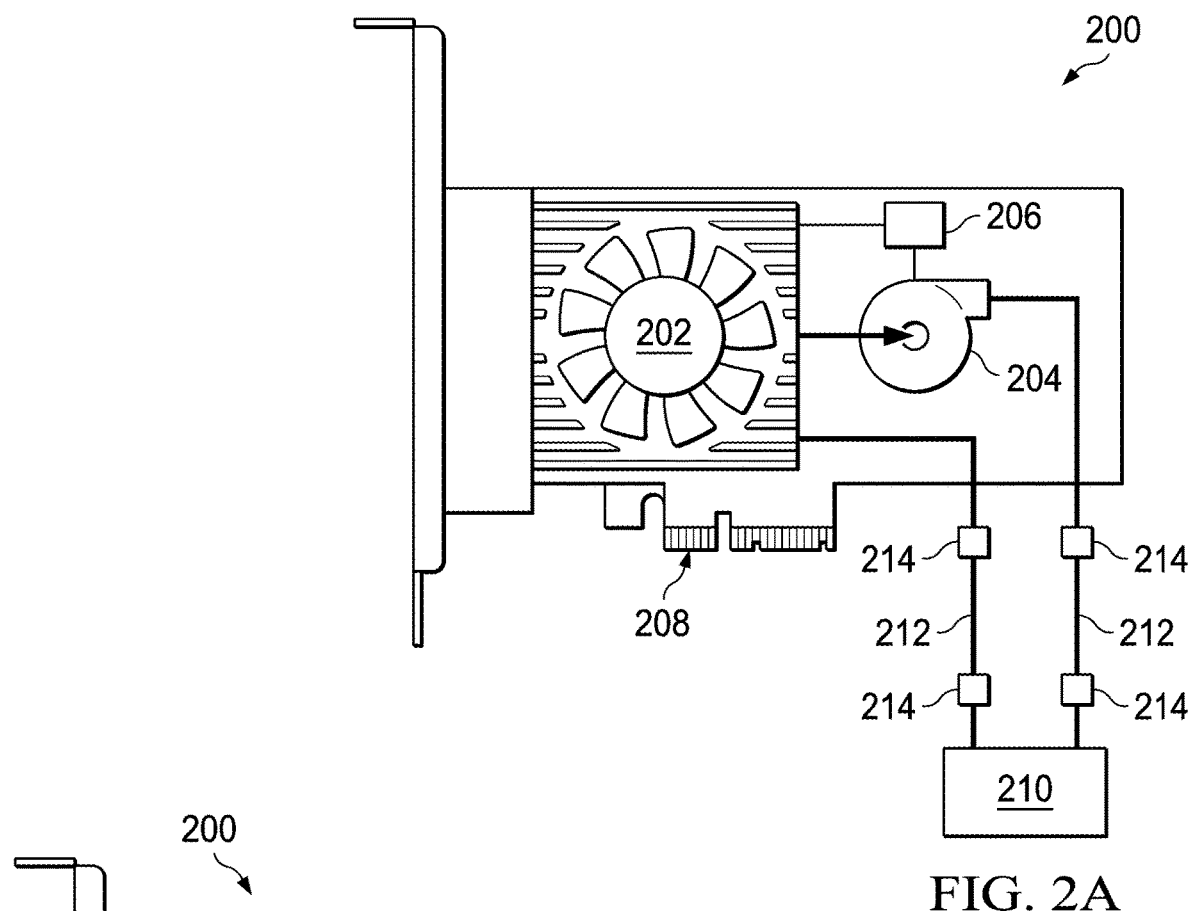
FIGS. 2A and 2B illustrate cooling cards, in accordance with some embodiments of the present disclosure.
Figure 2B:
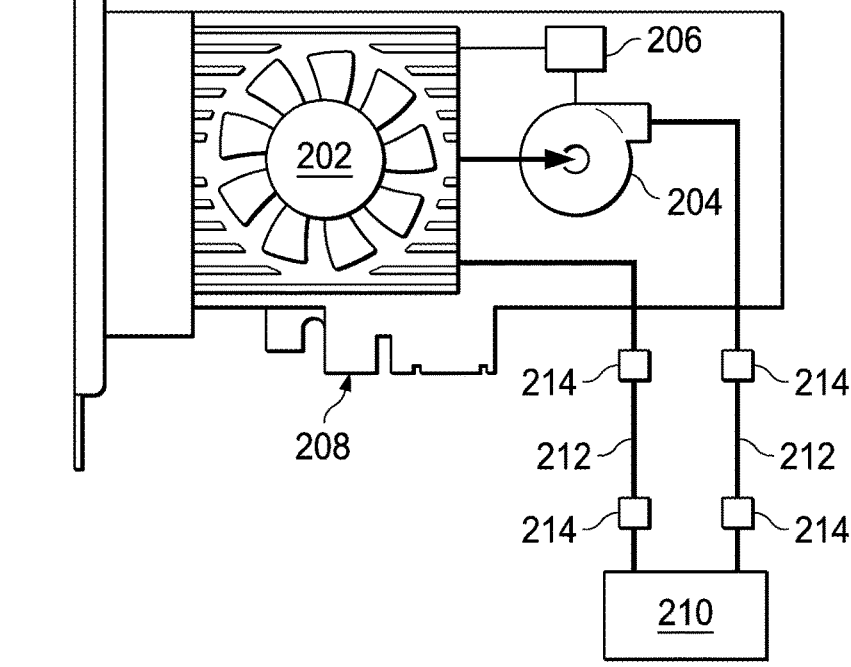

Turning now to FIGS. 2A and 2B, embodiments of a cooling card 200 are shown which may be used to implement various aspects of the present disclosure. Cooling card 200 is an example of the type of device that may be used to implement cooling card 124 from FIG. 1.

As shown in FIGS. 2A and 2B, cooling card 200 may be implemented in a standard PCIe form factor to provide modular cooling to an information handling system. Cooling card 200 may be used to provide cooling of an information handling resource via heat exchanger 210, and exhaust waste heat from an information handling system.

In some embodiments, heat exchanger 210 may include standard mounting hardware to allow it to be attached to a processor or other information handling resource of the information handling system in which cooling card 200 is mounted. In particular, cooling card 200 may be used to cool an information handling resource that is not part of cooling card 200.

In various embodiments, cooling card 200 may be a single-width PCIe card, a double-width PCIe card, a full-length PCIe card, or any other desired form factor. The use of such standard PCIe embodiments may allow for cooling card 200 to be relatively massive (e.g., ~1200 grams in some embodiments), providing a large amount of supplemental cooling for an information handling system such as information handling system 102.

As shown, cooling card 200 may include heatsink/fan 202, as well as pump 204. Heatsink/fan 202 may include fluid channels therein; in other embodiments, heatsink/fan 202 may be coupled to an on-card heat exchanger (not shown) on cooling card 200, which may include fluid channels therein. Either of these situations may be referred to generally as heatsink/fan being coupled to a fluid channel.

The inclusion of pump 204 on cooling card 124 (e.g., as opposed to placing pump 204 elsewhere in the information handling system) may provide additional size and convenience benefits. Pump 204 may cause a cooling fluid to circulate (e.g., via tubing 212) from pump 204, through heat exchanger 210, through fluid channels of heatsink/fan 202, and back to pump 204. Tubing 212 may be coupled between cooling card 200 and heat exchanger 210 via one or more quick-connect fluid fittings such as fittings 214 in some embodiments. Heat exchanger 210 may be coupled to a processor or other information handling resource of the information handling system in which cooling card 200 is inserted. The cooling fluid may absorb heat at heat exchanger 210 and emit heat at heatsink/fan 202.

In some embodiments, heatsink/fan 202 may be shaped and arranged such that its fan causes air to be exhausted outward from an information handling system (e.g., toward the left in the perspective shown in FIG. 2). For example, cooling card 200 may include a shroud around heatsink/fan 202 to direct airflow in a desired direction.

In some embodiments, all or a portion of cooling card 200 may be powered via the standard electrical connections in card connection 208.

In other embodiments, all or a portion of cooling card 200 may be powered via auxiliary power connector 206, which may for example be connected to a power supply unit of an information handling system. In such embodiments, as shown in FIG. 2B, cooling card 200 may optionally omit the electrical connections of card connection 208, instead using card connection 208 simply for mechanical support.

In some embodiments, alternatively or in addition, cooling card 200 may communicate electronically (e.g., via card connection 208) with an information handling system to provide a device identifier for cooling card 200. Such a device identifier may be a "dummy" device identifier, including selected values for device ID, subdevice ID, vendor ID, subvendor ID, and/or any other field specified by the expansion slot into which cooling card 200 is inserted. Such device identifier information may be communicated to an information handling system in any suitable manner, such as via an I2C bus or via any other communications medium (e.g., wired or wireless). Such communications may be accomplished, for example, via a microcontroller or other circuitry included on cooling card 200.

In such embodiments, the information handling system may detect the presence of cooling card 200 by recognizing its device identifier, and may then manage its cooling based on such presence. For example, if cooling card 200 were installed in host system 98 of information handling system 102, its presence might be detected by any or all of host system 98, information handling system 102, or management controller 112. Any or all of these systems may then adjust an overall cooling solution (e.g., fan speeds, component throttling, etc.) based on the presence of cooling card 200, which may be assumed to provide some additional cooling.

In some embodiments, communications with an information handling system may be bidirectional. For example, once the information handling system has recognized cooling card 200, it may control the fan speed and/or pump speed of cooling card 200 to adjust the amount of cooling being provided thereby.

Thus in various embodiments, cooling card 200 may be added modularly to an information handling system to provide cooling to an information handling resource, which need not be mounted on cooling card 200 itself, but may instead be an integral component of the information handling system.

Turning now to FIG. 3, a flow chart of an example method 300 is shown for cooling an information handling resource, in accordance with certain embodiments of the present disclosure. According to some embodiments, method 300 may begin at step 302. As noted above, teachings of the present disclosure may be implemented in a variety of configurations, such as within the context of information handling systems 102.

At step 304, a cooling card such as cooling card 200 may be coupled to an information handling system such as information handling system 102. Such coupling may be accomplished via an expansion slot such as a PCIe slot, as described above in more detail. The cooling card may include a heatsink, which may include or be coupled to a fluid channel. As noted above, in some embodiments, an additional power connection may also be attached via auxiliary power connector 206. Further, in some embodiments, the information handling system may be in signal communication with the cooling card (e.g., once the information handling system is restarted).

At step 306, the heatsink of the cooling card may be fluidically coupled to a heat exchanger. The heat exchanger may be a separate component that is not mounted on the cooling card, and it may be mountable on a processor or other high-heat, high-power information handling resource of the information handling system. In some embodiments, the fluidically coupling may be accomplished via one or more quick-connect fluid fittings.

At step 308, method 300 may end.

Although FIG. 3 discloses a particular number of steps to be taken with respect to method 300, method 300 may be executed with greater or lesser steps than those depicted in FIG. 3. In addition, although FIG. 3 discloses a certain order of steps to be taken with respect to method 300, the steps comprising method 300 may be completed in any suitable order.

Method 300 may be implemented using information handling system 102 or any other system operable to implement method 300.

Various embodiments of the present disclosure have been described above. In these and other embodiments, additional features (or fewer features) may also be present. For example, in some embodiments, a cooling card may omit the pump and/or the heatsink. In some of such embodiments, a cooling card may simply include a fan designed to be modularly added to an information handling system and to exhaust hot air therefrom. In some of such embodiments, a pump may be an integral part of the information handling system rather than being part of the cooling card.

In some embodiments, a cooling card may be implemented as a relatively simple device. For example, in embodiments in which no device identifier is needed, a cooling card may be implemented with no processing circuitry thereon. Indeed, some embodiments may include no integrated circuits whatsoever on the cooling card.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
   a power supply unit;
   a circuit board that includes a plurality of expansion slots;
   a cooling card coupled to at least one of the plurality of expansion slots; and
   a processor coupled to the circuit board, wherein the processor includes a heat exchanger coupled thereto, and wherein the cooling card does not comprise the processor;
   wherein the cooling card includes:
      a fan on a heatsink configured to transfer heat away from the information handling system;
      a fluid channel thermally coupled to the heatsink, the fluid channel being fluidically coupled to the heat exchanger via a pump;
      a power connector configured to couple to the power supply unit; and
      an edge connector configured to mechanically couple to the at least one of the plurality of expansion slots, wherein the edge connector does not include electrical contacts thereon;
   wherein the fan and the pump are configured to receive power via the power connector.

2. The information handling system of claim 1, wherein the cooling card is a Peripheral Component Interconnect Express (PCIe) card.

3. The information handling system of claim 2, wherein the cooling card is a double-width PCIe card.

4. The information handling system of claim 1, wherein the cooling card does not include any processors.

5. The information handling system of claim 1, wherein the circuit board is a motherboard.

6. The information handling system of claim 1, wherein the processor is a circuit selected from the group consisting of central processing units (CPUs) and graphics processing units (GPUs).

7. The information handling system of claim 1, wherein the information handling system includes another information handling resource having another heat exchanger, and wherein the fluid channel is fluidically coupled to the another heat exchanger.

8. A method comprising:
   coupling a cooling card that includes a fan on a heatsink configured to transfer heat away from an information handling system to an expansion slot of a circuit board of the information handling system, wherein the cooling card includes an edge connector that mechanically couples to the expansion slot, and wherein the edge connector does not include electrical contacts thereon, wherein the circuit board includes a processor, wherein the cooling card does not comprise the processor, and wherein the processor includes a heat exchanger;
   fluidically coupling a fluid channel of the heatsink to the heat exchanger via a pump; and
   providing power to the fan and the pump from a power supply unit of the information handling system via a power connector of the cooling card.

9. The method of claim 8, wherein the fluidically coupling includes coupling via at least one quick-connect fluid fitting.

10. An apparatus comprising:
    a cooling card configured to be accepted by an expansion slot of an information handling system, wherein the information handling system includes a power supply unit and a motherboard having a processor thereon, wherein the cooling card does not comprise the processor;
    wherein the cooling card includes:
       an edge connector configured to mechanically couple to the expansion slot, wherein the edge connector does not include electrical contacts thereon;
       a fan on a heatsink configured to transfer heat away from the information handling system;
       a fluid channel thermally coupled to the heatsink, the fluid channel being fluidically coupled, via a pump, to a heat exchanger that is configured to couple to the processor; and
       a power connector configured to couple to the power supply unit;
    wherein the fan and the pump are configured to receive power via the power connector.

11. The apparatus of claim 10, wherein the cooling card does not include any integrated circuits.

12. The apparatus of claim 10, wherein the cooling card does not include a second processor.

* * * * *